United States Patent
Tashiro et al.

(10) Patent No.: US 6,950,721 B2
(45) Date of Patent: Sep. 27, 2005

(54) POSITIONING SUBSTRATE FOR SEMICONDUCTOR PROCESS

(75) Inventors: Makoto Tashiro, Nirasaki (JP); Keisuke Kondoh, Nirasaki (JP); Hiroaki Saeki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 225 days.

(21) Appl. No.: 10/391,574

(22) Filed: Mar. 20, 2003

(65) Prior Publication Data
US 2004/0018745 A1 Jan. 29, 2004

(30) Foreign Application Priority Data
Mar. 22, 2002 (JP) ...................................... 2002-080118

(51) Int. Cl.⁷ .............................................. G06F 7/00
(52) U.S. Cl. ........................... 700/213; 414/935; 901/3
(58) Field of Search ................................ 700/213, 114, 700/121, 125, 264; 414/935, 936; 901/3, 9, 10; 318/568.13

(56) References Cited

U.S. PATENT DOCUMENTS

| 5,980,367 | A | * | 11/1999 | Metcalf | 451/285 |
|---|---|---|---|---|---|
| 6,032,512 | A | * | 3/2000 | Li | 73/1.79 |
| 6,361,648 | B1 | * | 3/2002 | Tobin | 118/719 |
| 6,463,782 | B1 | * | 10/2002 | Shen et al. | 73/1.79 |
| 6,510,365 | B1 | | 1/2003 | Nishinakayama et al. | |
| 6,643,564 | B2 | * | 11/2003 | Kataoka et al. | 700/258 |
| 6,695,914 | B2 | * | 2/2004 | Curtis et al. | 118/50 |

* cited by examiner

Primary Examiner—Khoi H. Tran
(74) Attorney, Agent, or Firm—Oblon, Spivak, McClelland, Maier & Neustadt, P.C.

(57) ABSTRACT

A positioning substrate is used for performing a teaching operation on a transfer mechanism for transferring a target substrate in a semiconductor processing system. The positioning substrate includes a substrate body made of a material selected from the group consisting of the same material as the target substrate, semiconductor, compound semiconductor, and ceramic. The substrate body has an outer contour sized to be handled by the transfer mechanism as an alternative to the target substrate. The positioning substrate also includes a positioning assistant having a combination of a positioning hole and a positioning reference line formed in the substrate body. The positioning hole is formed to penetrate the substrate body in a thickness direction. The positioning reference line is formed on a surface of the substrate body to extend across an opening of the positioning hole and have a predetermined width.

15 Claims, 13 Drawing Sheets

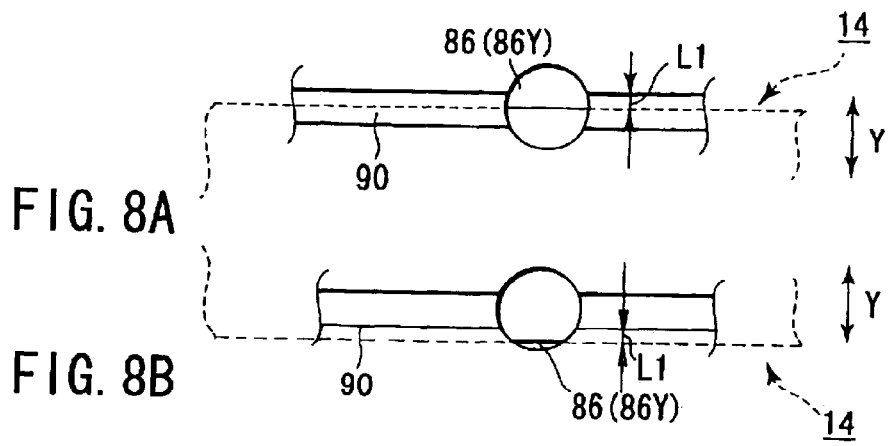
FIG. 8A
FIG. 8B
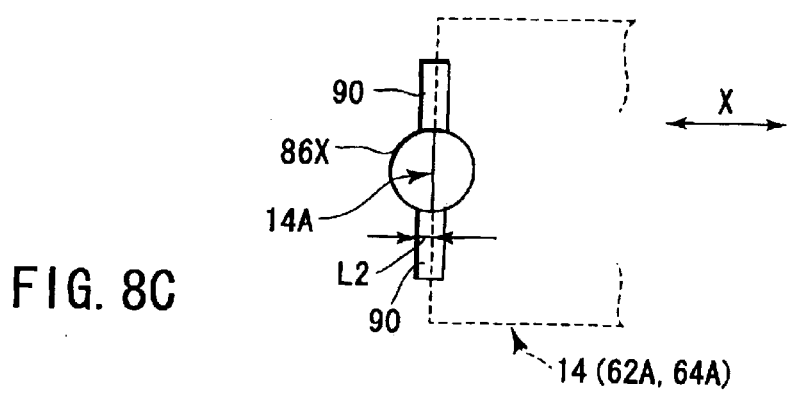
FIG. 8C
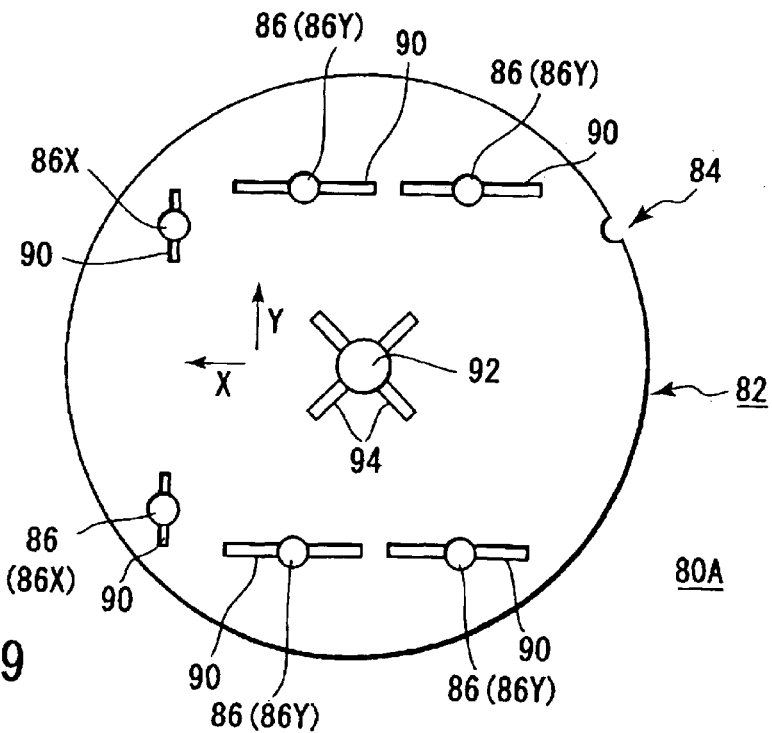
FIG. 9

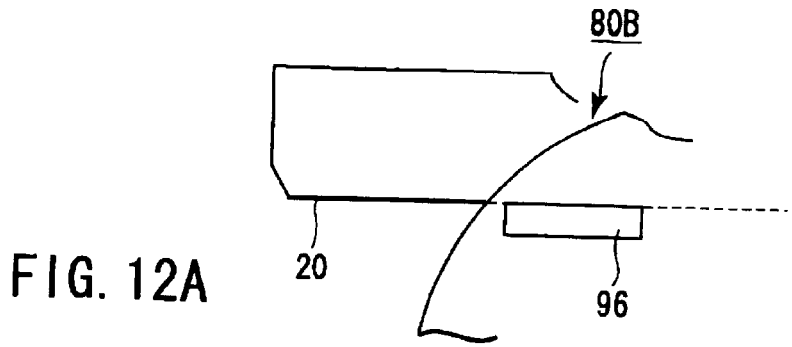
FIG. 12A
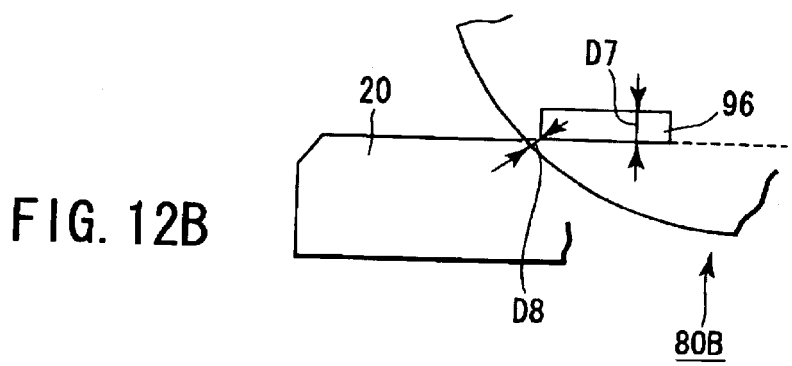
FIG. 12B
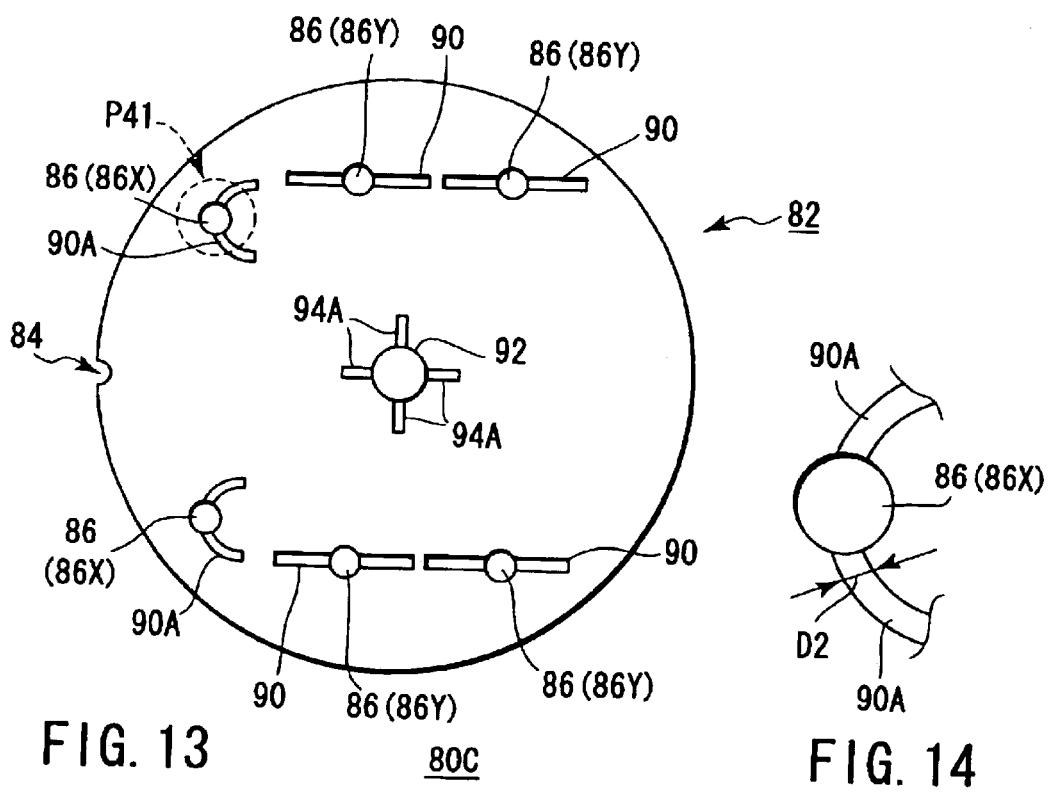
FIG. 13
FIG. 14

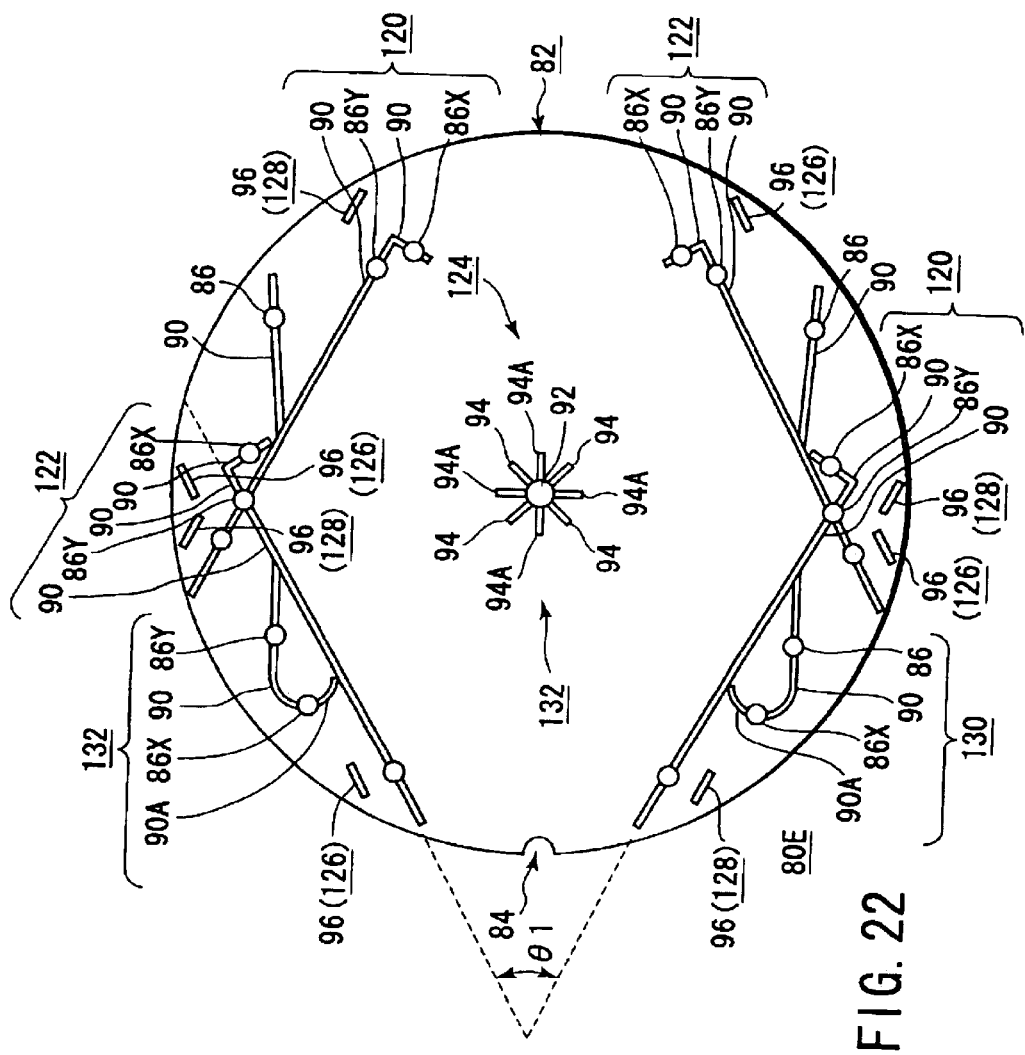

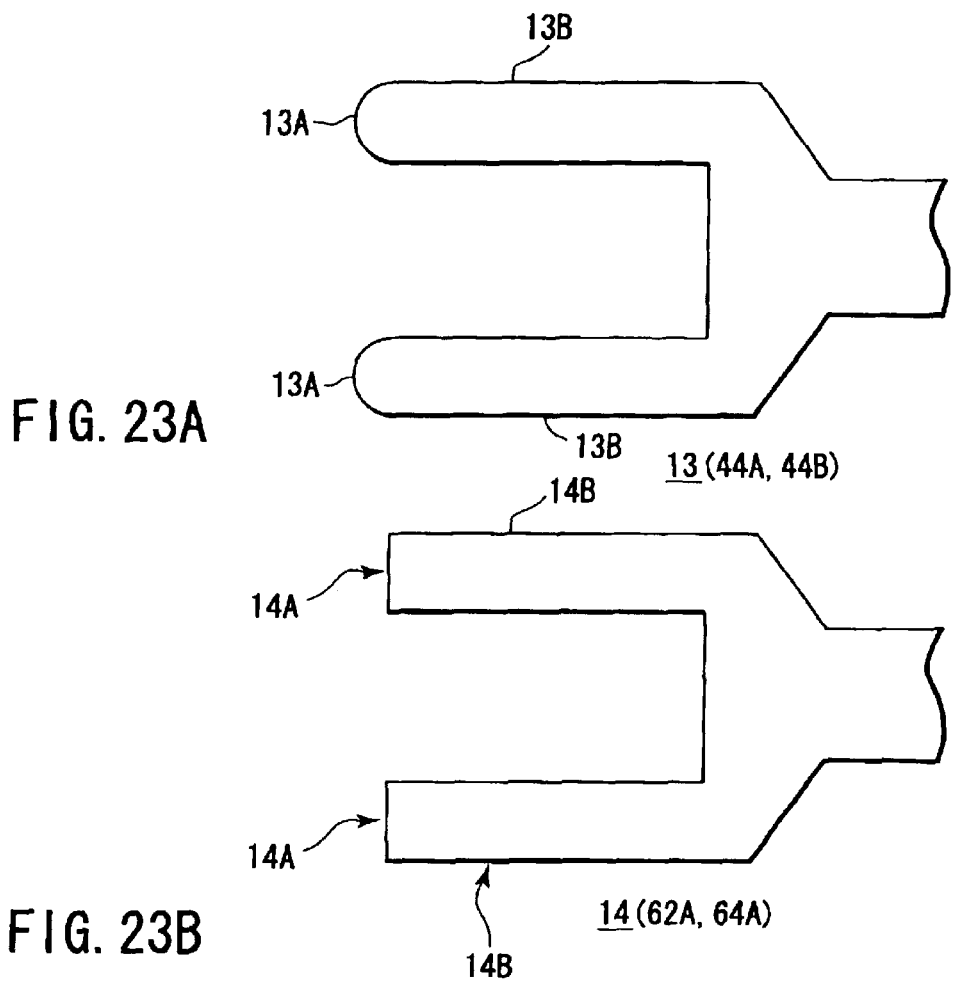
FIG. 23A
FIG. 23B
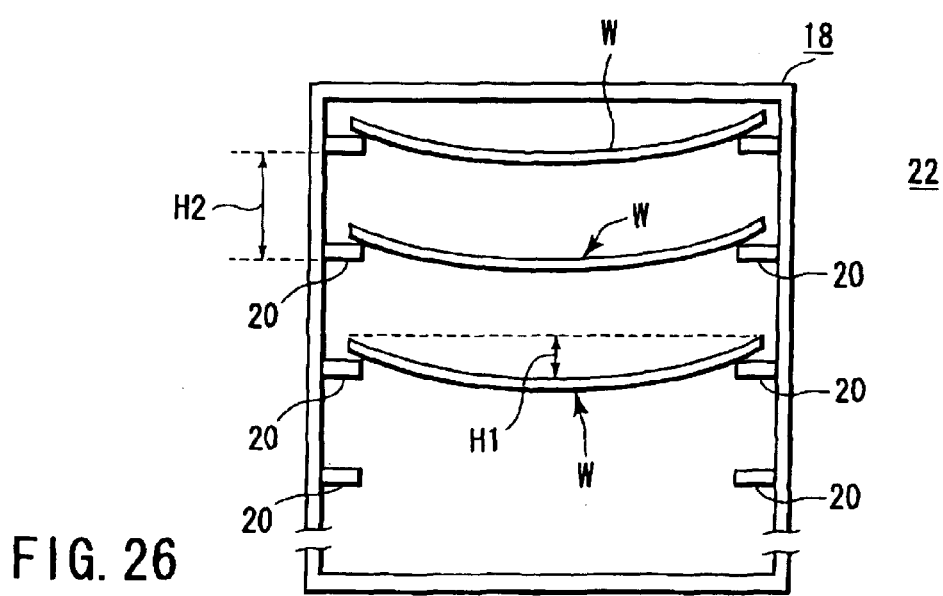
FIG. 26

POSITIONING SUBSTRATE FOR SEMICONDUCTOR PROCESS

CROSS-REFERENCE TO RELATED APPLICATIONS

This application is based upon and claims the benefit of priority from the prior Japanese Patent Application No. 2002-080118, filed Mar. 22, 2002, the entire contents of which are incorporated herein by reference.

BACKGROUND OF THE INVENTION

1. Field of the Invention

The present invention relates to a positioning substrate for a semiconductor process, which is used for performing a teaching operation on a transfer mechanism for transferring a target substrate in a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

2. Description of the Related Art

In the process of manufacturing semiconductor devices, a wafer is subjected to various semiconductor processes, such as film formation, etching, oxidation, diffusion, and so forth. In these processes, owing to the demands of increased miniaturization and integration of semiconductor devices, the throughput and yield involving these processes need to be increased. In light of this, there is a semiconductor processing system of the so-called cluster tool type, which has a plurality of process chambers for performing the same process, or a plurality of process chambers for performing different processes, connected to a common transfer chamber. With this system, various steps can be performed in series, without exposing a wafer to air.

One type of this processing system includes, at its front, a port structure for placing a semiconductor wafer cassette. Each wafer in the cassette is taken into the system by a transfer mechanism, and is subjected to an alignment operation by an alignment device, and then is transferred into a load-lock chamber, whose pressure is adjustable between a vacuum and atmospheric pressure. Then, the wafer is transferred into a common vacuum transfer chamber, to which a plurality of vacuum processing apparatuses are connected therearound. The wafer is sequentially transferred into the vacuum processing apparatuses from the common transfer chamber at the center, so that it is subjected to processes in the apparatuses. After the wafer is processed, it is returned, for example, into the original cassette through the same route.

Such a processing system has a single or a plurality of transfer mechanisms, by which a wafer is automatically transferred from one place to another. Each transfer mechanism has a holding pick, which is, for example, extensible/contractible, swingable, and movable up and down. The holding pick directly holds a wafer, and moves horizontally to a transfer position, so that the wafer is transferred to a predetermined place.

It is necessary to prevent the holding pick and a wafer placed thereon from interfering or colliding with other members, while the transfer mechanism is moving. It is also necessary for the holding pick to properly pick up a wafer placed at a certain place, and transfer it to a destination, and delivers it to an appropriate position, with high positional accuracy, such as within ±0.20 mm.

Accordingly, after a system is assembled or extensively altered, a so-called teaching operation is performed on the control section, such as a computer, for controlling its transfer mechanism. The teaching operation is performed to teach important positions, such as a place in its movement route where the holding pick of the transfer mechanism delivers a wafer W, as coordinate positions to the control section.

The teaching operation is performed for the positional relationships between the holding pick and almost all the places for wafer delivery, and their coordinate positions are stored into the control section. For example, these positional relationships include the positional relationship between the holding pick and a cassette; the positional relationship between the holding pick and each of the shelves of the cassette in the vertical direction for picking up wafers; the positional relationship between the holding pick and the table of a load-lock chamber; the positional relationship between the holding pick and an alignment device, the positional relationship between the holding pick and the susceptor of a vacuum processing apparatus; and the like. The driving system of each transfer mechanism is provided with an encoder or the like built therein for specifying the movement position.

FIGS. 23A and 23B are plan views showing two examples of holding picks having different shapes for a transfer mechanism. FIG. 23A shows a holding pick 13 with a bifurcate shape, whose distal ends 13A and 13A each form an essentially semi-circular arc. FIG. 23B shows a holding pick 14 also with a bifurcate shape, whose distal ends 14A and 14A each form an essentially right-angled flat line.

Next, an explanation will be given of a positioning substrate used for the teaching operation. FIGS. 24 and 25 are a plan view and a sectional view, respectively, showing a conventional positioning substrate corresponding to the holding pick shown in FIG. 23A. Other than the positioning substrate shown in FIG. 24, a positioning substrate disclosed in, e.g., Jpn. Pat. Appln. KOKAI Publication No. 8-64547 is also known.

As shown in FIGS. 24 and 25, this conventional positioning substrate 2 has a substrate body 4, which is like a circular plate, and is formed from a transparent resin material, such as polycarbonate resin. The substrate body 4 has the same diameter as an actual semiconductor wafer to be processed in the processing system. The substrate body 4 is provided with a positioning cut, such as a notch 6, formed at a position on the peripheral edge. The substrate body 4 is also provided with a reference hole 8 at the center, which is formed of a through-hole having a predetermined inner diameter.

At the center and periphery on the surface of the substrate body 4, circular and ring light-shielding coatings 10 and 12 of, e.g., organic coating, are formed, respectively, to correspond to detection target positions by optical sensors for detecting the presence or absence of a wafer. The light-shielding coatings 10 and 12 allow the optical sensors disposed at the necessary positions in the processing system to recognize the presence of the substrate body 4. Furthermore, on the surface of the substrate body 4, a pair of thin reference lines 16 are formed to correspond to the outer contour (the lateral side 13B or distal end 13A) of the holding pick 13 shown in FIG. 23A.

When a teaching operation is performed, the coordinate positions of places to be taught in the entire system are first obtained from designed values, using a point on the movement route of a transfer mechanism as the absolute reference. These are inputted and stored into the control section as provisional coordinate positions. In this case, each of the provisional coordinate positions is inputted with a predetermine margin such that a holding pick does not interfere with another member.

Then, on the basis of each provisional coordinate position, the transfer mechanism is driven to move the holding pick to a position near a teaching reference position. Then, the operation of the transfer mechanism is switched to a manual mode (which may be simply referred to as "manually"), and, for example, the holding pick 13 shown in FIG. 23A is brought into contact with a positioning substrate 2, which is placed in advance on a predetermined position in a cassette. Then, the transfer mechanism is manually operated with visual observation, so that the contour of the holding pick 13 accurately aligns with the reference lines 16 of the positioning substrate 2. When they align with each other, coordinate data obtained at this time is stored as its coordinate position in the control section.

When a positioning operation is performed for the movement of the transfer mechanism relative to an alignment device, it is performed as follows. First, with visual observation, the positioning substrate 2 is placed on the holding pick 13, such that its contour accurately aligns with the reference lines 16. Then, the holding pick 13 is manually moved to place the positioning substrate 2 on the rotary table of the alignment device. At this time, a reference hole 8 formed at the center of the positioning substrate 2 is caused to accurately align with the central position of the rotary table. Coordinate data obtained at this time is stored as its coordinate position in the control section. The manual mode ("manually") described above means inputting a movement direction (+/−) and a movement amount into a control section by a keyboard or joystick, to operate a transfer mechanism.

When a positioning operation is performed relative to a table or susceptor of a load-lock chamber or a vacuum processing apparatus, it is performed as follows. First, the positioning substrate 2 is placed at the center of the table or susceptor. Then, the corresponding holding pick 13 is manually moved so that the holding pick 13 accurately aligns with the reference lines of the positioning substrate. Coordinate data obtained when they align with each other is stored as its coordinate position in the control section.

Incidentally, a processing system of this kind is used to perform a micro-processing or the like on a semiconductor wafer. Accordingly, it is necessary to prevent particles or impurities from entering the processing system, as much as possible. However, as described above, the positioning substrate 2 is made of a resin material, such as polycarbonate resin, and the light-shielding coatings 10 and 12 formed thereon are made of components mainly of organic substances. As a consequence, during a teaching operation, fine pieces from the substrate body 4 or light-shielding coatings 10 and 12 are scattered as particles in the processing system, and cause problems, such as organic contamination on a semiconductor wafer. Particularly, in recent years, as devices are becoming more and more highly miniaturized and integrated, and the line width has decreased to submicron level, it is demanded to solve the problems described above as early as possible.

As shown in FIG. 26, a plurality of, e.g., about 25 at most, semiconductor wafers are accommodated in a cassette 22, which is a box-like container 18 made of Teflon (registered TM) with shelves 20 layered at regular intervals on the inner wall. Each semiconductor wafer W has a very small thickness of, e.g., about 0.8 mm, although it depends on the wafer size. Accordingly, when the wafer W is supported by shelves 20 at opposite ends, it is inevitable for the wafer W to bend downward with a certain warp amount H1, as shown in FIG. 26.

A semiconductor wafer W used in a processing system and the positioning substrate 2 made of polycarbonate resin for a teaching operation differ in stiffness, and thus they also show different warp amounts H1. During a teaching operation, the positioning substrate 2 is placed on each pair of shelves 20, and a height position of the holding pick 13 for accessing the substrate 2 is stored as a coordinate position for each pair of shelves 20. However, as described above, since they show different warp amounts H1, problems arise, e.g., wafer W transfer errors occur at worst.

The intervals H2 between the shelves 20 are preset as small as possible, e.g., about 10 mm, to hold a number of wafers W therein, and thus their coordinate positions have to be set with high accuracy.

Particularly, the warp amount H1 is small when the wafer size is 6 inches (15 cm) or 8 inches (20 cm), but it is considerably large when the wafer size is 12 inches (30 cm). In the latter case, the difference in the warp amount is not negligible.

It may be conceivable to increase the stiffness of the positioning substrate, so that the positioning substrate 2 shows the same warp amount H1 as semiconductor wafers W. However, in order to increase the stiffness, the positioning substrate 2 has to be thicker, thereby causing a change in distance relative to a wafer placed on upper or lower side. Besides, since the positioning substrate 2 becomes heavier, the arm of the transfer mechanism undesirably shows a different warp amount, when the holding pick 13 of the transfer mechanism holds the positioning substrate 2.

Furthermore, where a teaching operation is performed again after a processing apparatus or the like of a processing system is repaired, a part of the system may be not sufficiently cooled but still have residual heat. In this case, the positioning substrate 2 made of resin that is not heat-resistant may cause problems, such as deformation by the part having residual heat.

BRIEF SUMMARY OF THE INVENTION

An object of the present invention is to provide a positioning substrate, which can prevent organic contamination, and allow a teaching operation with high positional accuracy.

According to a first aspect of the present invention, there is provided a positioning substrate for performing a teaching operation on a transfer mechanism for transferring a target substrate in a semiconductor processing system, the positioning substrate comprising:

a substrate body made of a material selected from the group consisting of the same material as the target substrate, semiconductor, compound semiconductor, and ceramic; and a positioning assistant comprising a combination of a positioning hole and a positioning reference line formed in the substrate body, the positioning hole being formed to penetrate the substrate body in a thickness direction, and the positioning reference line being formed on a surface of the substrate body to extend across an opening of the positioning hole and have a predetermined width.

According to a second aspect of the present invention, there is provided a positioning substrate for performing a teaching operation on a transfer mechanism for transferring a target substrate in a semiconductor processing system, the positioning substrate comprising:

a substrate body made of a material selected from the group consisting of the same material as the target substrate, semiconductor, compound semiconductor, and ceramic; and a plurality of positioning-assist groups, each of which comprises a plurality of positioning assistants, each positioning assistant comprising a combination of a positioning hole and a positioning reference line formed in the substrate body, the positioning hole being formed to penetrate the substrate body in a thickness direction, and the positioning reference line being formed on a surface of the substrate body to extend across an opening of the positioning hole and have a predetermined width, wherein the plurality of positioning assistants of each positioning-assist group are disposed at a plurality of positions on a contour of a holding pick of the transfer mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 8A, 8B, and 8C are enlarged views respectively showing portions P11, P12, and P13 in FIG. 3, when the positioning substrate is placed with a misalignment;

FIG. 9 is a plan view showing a positioning substrate according to a second embodiment of the present invention;

FIGS. 12A and 12B are enlarged views respectively showing portions P31 and P32 in FIG. 11, when the positioning substrate shown in FIG. 11 is placed on shelves of a cassette;

FIG. 13 is a plan view showing a positioning substrate according to a fourth embodiment of the present invention;

FIG. 14 is an enlarged view showing a portion P41 shown in FIG. 13;

FIG. 22 is a plan view showing a positioning substrate according to a sixth embodiment of the present invention;

FIGS. 23A and 23B are plan views showing two examples of holding picks having different shapes for a transfer mechanism;

FIG. 26 is a side view showing a cassette in which semiconductor wafers are supported by shelves layered at regular intervals.

DETAILED DESCRIPTION OF THE INVENTION

Figure 1:
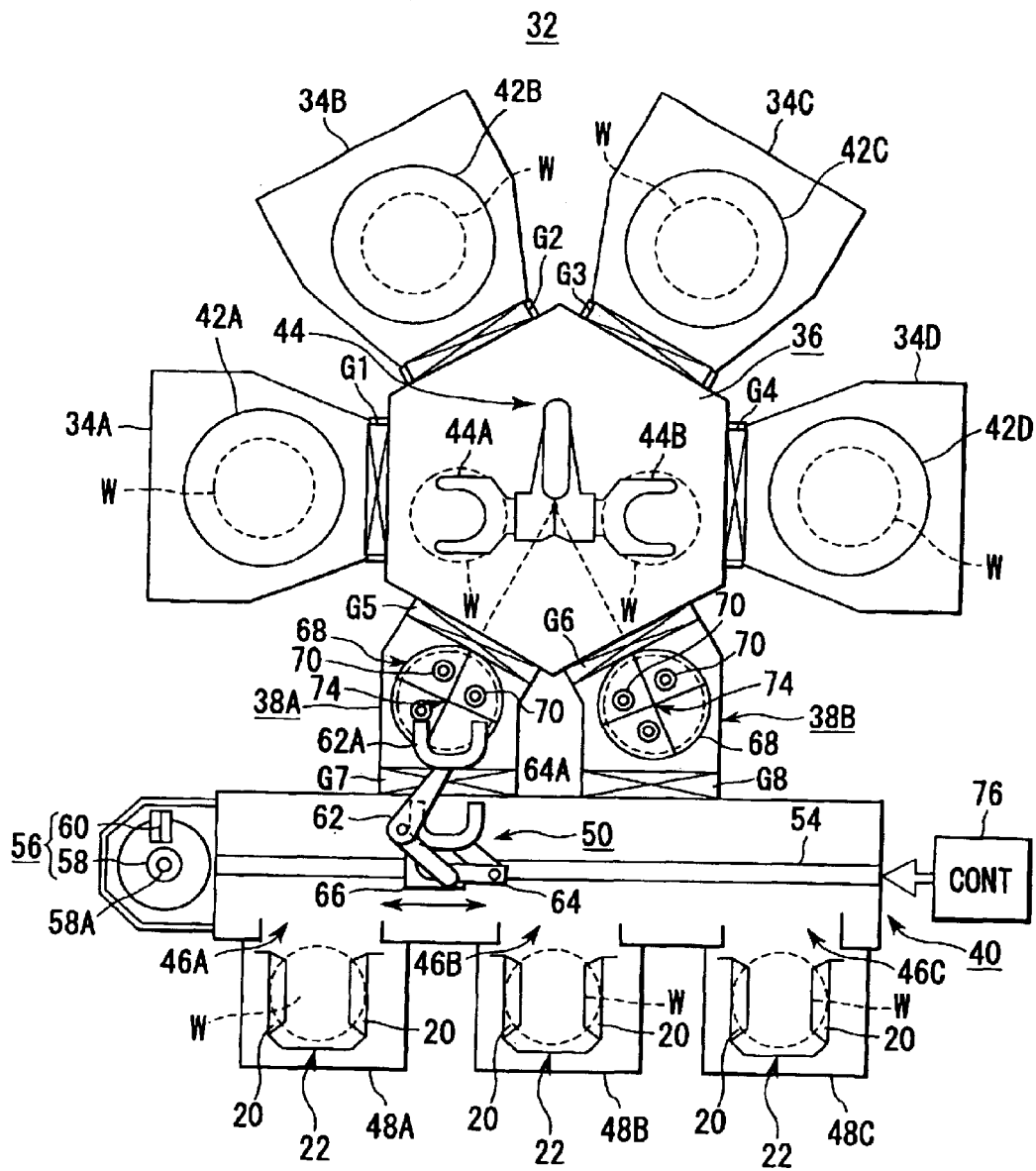
FIG. 1 is a plan view schematically showing a semiconductor processing system, in which a teaching operation is performed, using a positioning substrate according to an embodiment of the present invention.

Embodiments of the present invention will now be described with reference to the accompanying drawings. In the following description, the constituent elements having substantially the same function and arrangement are denoted by the same reference numerals, and a repetitive description will be given only when necessary.

<Semiconductor Processing System>

FIG. 1 is a plan view schematically showing a semiconductor processing system, in which a teaching operation is performed, using a positioning substrate according to an embodiment of the present invention.

As shown in FIG. 1, a semiconductor processing system 32 includes a plurality of, e.g., four, processing apparatuses 34A, 34B, 34C, and 34D, a common transfer chamber 36 having an essentially hexagonal shape, first and second load-lock chambers 38A and 38B having a load-lock function, and a laterally long I/O transfer chamber 40. The common transfer chamber 36 and first and second load-lock chambers 38A and 38B are each formed of an airtight chamber, which can be vacuum-exhausted.

Specifically, the processing apparatuses 34A to 34D are respectively connected to four sidewalls of the common transfer chamber 36 having an essentially hexagonal shape, and the first and second load-lock chambers 38A and 38B are respectively connected to the other two sidewalls. In other words, the processing system 32 has a structure of the cluster tool type, in which the processing apparatuses and load-lock chambers are disposed around and connected to the common transfer chamber 36. The first and second load-lock chambers 38A and 38B are connected to the I/O transfer chamber 40 in common. The processing apparatuses 34A to 34D and first and second load-lock chambers 38A and 38B are connected to the common transfer chamber 36, respectively through gate valves G1 to G4, and G5 and G6, which can be opened and airtightly closed. The first and second load-lock chambers 38A and 38B are connected to the I/O transfer chamber 40, respectively through gate valves G7 and G8, which can be opened and airtightly closed.

The four processing apparatuses 34A to 34D are designed to perform processes of the same kind or different kinds on a target substrate or semiconductor wafer W in a vacuum atmosphere. The processing apparatuses 34A to 34D are respectively provided with susceptors 42A to 42D therein, for placing a wafer thereon. A first transfer mechanism 44, which is formed of an articulated arm and is extensible/contractible, swingable, and movable up and down, is disposed at a position on one side in the common transfer chamber 36, where it can access each of the two load-lock chambers 38A and 38B and four processing apparatuses 34A to 34D.

The first transfer mechanism 44 has two holding picks 44A and 44B, which are extensible/contractible toward opposite directions and independently of each other, so that it can handle two wafers at one time. In this embodiment, each of the holding picks 44A and 44B has a shape, e.g., as shown in FIG. 23A. The first transfer mechanism 44 may be designed to have only one holding pick.

The I/O transfer chamber 40 is formed of a laterally long casing. On one side of this laterally long casing, one or more, e.g., three in this embodiment, ports 46A, 46B, and 46C are formed, for transferring a target substrate or semiconductor wafer W thereinto and therefrom. The ports 46A to 46C are respectively provided with port structures 48A, 48B, and 48C for a wafer cassette. Each of the port structures 48A, 48B, and 48C is structured to place one wafer cassette 22 thereon. As shown in FIG. 26, the cassette 22 can accommodate a plurality of, e.g., 25, wafers with regular intervals therebetween in the vertical direction.

In the I/O transfer chamber 40, there is a second transfer mechanism 50 for transferring wafers W in the longitudinal direction of the chamber 40. The second transfer mechanism 50 is slidably supported on a guide rail 54 extending in the longitudinal direction of the I/O transfer chamber 40 at the center. The guide rail 54 is provided with a driving mechanism, such as a linear motor built therein, by which the second transfer mechanism 50 is moved along the guide rail 54.

At one end of the I/O transfer chamber 40, there is an alignment device or orientor 56 for performing alignment of a wafer. The orientor 56 has a rotary table 58, which is rotated by a driving motor (not shown) along with a wafer W placed thereon. A central mark 58A for positioning is formed at the center of the rotary table 58. An optical sensor 60 for detecting the peripheral edge of a wafer W is disposed beside the rotary table 58. The optical sensor 60 detects the positional direction of the notch or orientation flat of the water W, and misalignment of the center of the wafer W.

The second transfer mechanism 50 has two articulated transfer arms 62 and 64 disposed at two height levels. The transfer arms 62 and 64 are respectively provided with fork-like holding picks 62A and 64A at the end, on which a wafer W is directly placed. The transfer arms 62 and 64 are extensible/contractible in a radial direction from the center, and can be independently controlled to perform an extending/contracting action. The transfer arms 62 and 64 have rotational shafts coaxially and rotatably connected to a base. The transfer arms 62 and 64 can be rotated together relative to the base 66. Each of the holding picks 62A and 64B has a shape, e.g., as shown in FIG. 23B.

Figure 2:
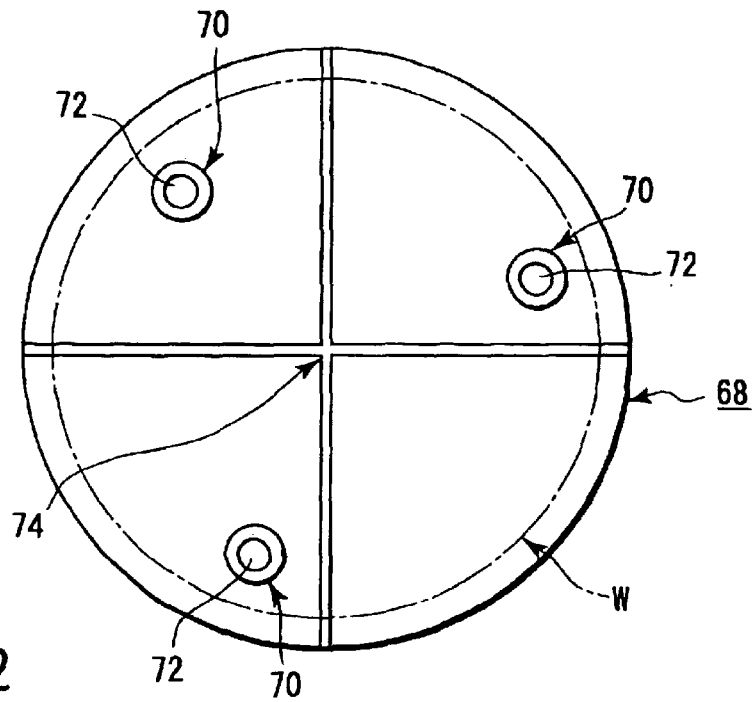
FIG. 2 is an enlarged plan view showing a table disposed in a load-lock chamber, in the processing system shown in FIG. 1.

Each of the first and second load-lock chambers 38A and 38B is provided with a table 68 therein for temporarily placing a wafer W thereon. FIG. 2 is an enlarged plan view showing the table 68. In the table 68, a plurality of, e.g., three in this embodiment shown in FIG. 2, lifter holes 70 are formed. The lifter holes 70 accommodate lifter pins 72, which are moved up and down to move wafer W in the vertical direction. The surface of the table 68 is provided with a criss-cross line mark 74, which is formed of two line segments having a very small line width of, e.g., about 0.3 mm, and perpendicularly intersect with each other at the center. As described later, the line mark 74 is used for positioning. One of the line segments of the criss-cross line mark 74 is directed toward the rotational center of the first transfer mechanism 44. The table 68 may be provided with pre-heating means or cooling means for heating or cooling a wafer W.

Optical sensors (not shown) are disposed at the necessary positions in the ports 46A to 46C, load-lock chambers 38A and 38B, and common transfer chamber 36. These optical sensors are used for detecting the presence or absence of a semiconductor wafer W, i.e., whether or not each of the second transfer mechanism 50 and first transfer mechanism 44 holds a wafer W. A control section 76 (see FIG. 1) formed of, e.g., a microcomputer is arranged to control the operation of the processing system 32 as a whole, such as the operation of the transfer mechanisms 44 and 50.

<First Embodiment>

Figure 3:
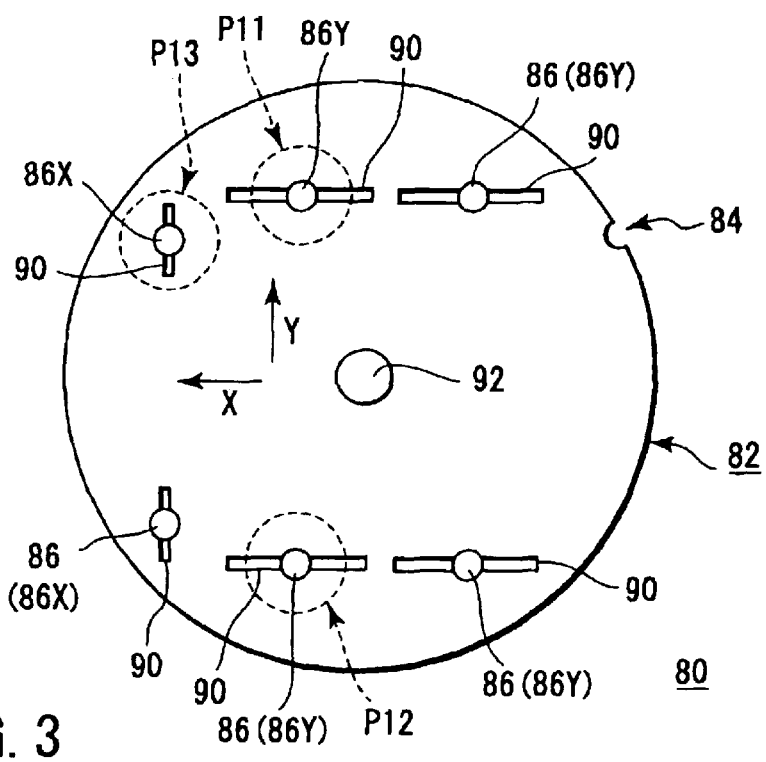
FIG. 3 is a plan view showing a positioning substrate according to a first embodiment of the present invention.
Figure 4A:
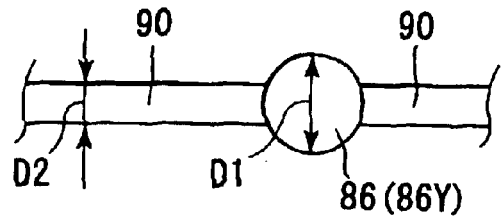
FIGS. 4A, 4B, and 4C are enlarged views respectively showing portions (positioning assistants) P11, P12, and P13 in FIG. 3.
Figure 4B:
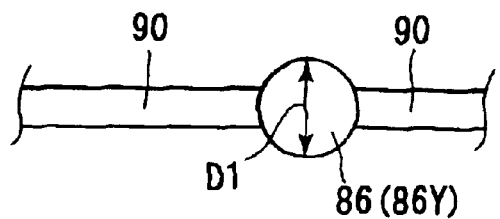
Figure 4C:
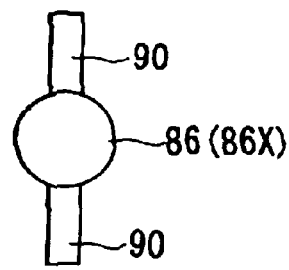
Figure 5:
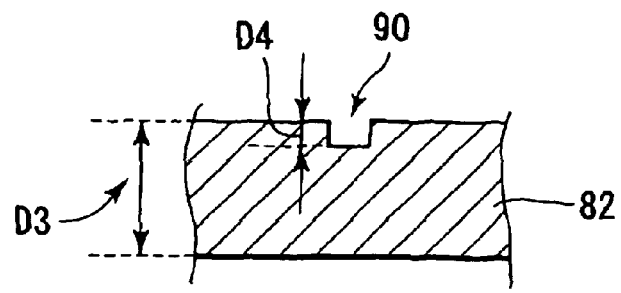
FIG. 5 is an enlarged sectional view showing a positioning reference line with a predetermined width in the positioning substrate shown in FIG. 3.

FIG. 3 is a plan view showing a positioning substrate according to a first embodiment of the present invention. FIGS. 4A, 4B, and 4C are enlarged views respectively showing portions (positioning assistants) P11, P12, and P13 in FIG. 3. FIG. 5 is an enlarged sectional view showing a positioning reference line with a predetermined width in the positioning substrate shown in FIG. 3.

As show in FIG. 3, this positioning substrate 80 has a substrate body 82, which is like a circular plate, and is optically opaque. The substrate body 82 is preferably made of the same material as semiconductor wafers W to be actually processed in the processing system 32. Specifically, where silicon wafers are processed in the processing system 32, the substrate body 82 is made of silicon. Where GaAs wafers are processed, the substrate body 82 is made of GaAs. However, without reference to the material of semiconductor wafers to be processed, the material of the body may be a semiconductor, such as silicon, or compound semiconductor, e.g., GaAs (gallium arsenide), or ceramic, which does not cause resin contamination.

The substrate body 82 has an outer contour sized such that it is handled by the transfer mechanisms as an alternative to a target substrate or wafer W. Preferably, the substrate body 82 has the same thickness and diameter of one wafer W. The substrate body 82 is provided with a positioning cut, e.g., a notch 84 in the embodiment shown in FIG. 3, formed at a position on the peripheral edge. In place of the notch 84, an orientation flat may be formed. Preferably, the notch or orientation flat has the same size as that of a wafer W to e processed.

A plurality of positioning holes 86 are formed at predetermined positions of the substrate body 82 and penetrate it in its thickness direction. Positioning reference lines 90 each having a predetermined width are formed on the surface of the substrate body 82 to intersect with or extend across the upper openings of the positioning holes 86. One positioning assistant is formed by the combination of one positioning hole 86 with the corresponding positioning reference line 90 extending across its upper opening. Such an arrangement may be adopted that a long positioning reference line extends across a plurality of positioning holes 86 separately disposed. This arrangement brings about formation of a plurality of positioning assistants.

The positioning substrate 80 shown in FIG. 3 is arranged to be used for the holding pick 14 shown in FIG. 23B. In the processing system shown in FIG. 1, the holding pick 14 is applied to the two holding picks 62A and 64A of the second transfer mechanism 50. Accordingly, the positioning assistants of the positioning substrate 80 are formed in consideration of the shape and dimensions of the holding pick 14 (62A, 64A).

Specifically, the positioning assistants formed of the positioning hole 86 and positioning reference line 90 combinations are disposed in accordance with the contour of the holding pick 14 (62A, 64A). Sine the holding pick 14 (62A, 64A) is bifurcated at the distal end, the positioning assistants are separated to the right and left sides, so that they are located along the contour of the holding pick.

Each of the positioning holes 86 has a diameter D1 of, e.g., about 3.5 mm, while each of the positioning reference lines 90 has a line width D2 of about 1 mm. The positioning reference lines 90 are, e.g., scribed lines formed by scoring, and thus each of them forms a groove having a rectangular section as shown in FIG. 5. While the substrate body 82 has a thickness D3 of, e.g., about 0.8 mm, the groove of the positioning reference lines 90 has a depth D4 of about 0.1 mm.

Each of the positioning holes 86 is not necessarily circular, and may be formed in another shape, such as rectangular. In any case, each positioning hole 86 is formed to have such a width that allows the contour of the holding pick 14 to be easily visually observed, in the longitudinal direction of the corresponding positioning reference line 90. If the width of each positioning hole 86 is too large, differences from a target substrate or wafer W, e.g., in weight, also become too large. The positioning reference line 90 is not necessarily a recess, and may be a projection on the substrate body 82.

The positioning assistants include assistants for positioning in the back-and-forth direction (X direction) of the holding pick 14 (62A, 64A), and assistants for positioning in the Y direction almost perpendicular to the X direction. Each of the X-direction positioning assistants has an X-direction positioning hole 86X, and each of the Y-direction positioning assistants has a Y-direction positioning hole 86Y.

The X-direction positioning holes 86X respectively correspond to the distal ends 14A, each forming an essentially right-angled flat line (see FIG. 23B), of the bifurcated holding pick 14 (62A, 64A). The positioning holes 86Y respectively correspond to the lateral sides 14B (see FIG. 23B) of the holding pick 14, and used as positioning holes for each contour line of the holding pick 14 (62A, 64A) in the longitudinal direction. Each of the number of the X-direction positioning assistants and the number of the Y-direction positioning assistants is, e.g., two or more, to improve the positioning accuracy.

It should be noted that each positioning reference line 90 is formed such that one of the two boundary lines defining the line width of 1 mm (corresponding to opposite sides of the scored groove) is to align with the contour of the holding pick 14 (62A, 64A). For example, in this embodiment, each positioning reference line 90 is scored such that the boundary line on the outer side in the radial direction of the substrate body 82 accurately corresponds to the contour of the holding pick 14 (62A, 64A).

Furthermore, a central positioning hole 92 is formed at the center of the substrate body 82, such that it has a slightly larger diameter and penetrates the body.

Figure 4D:
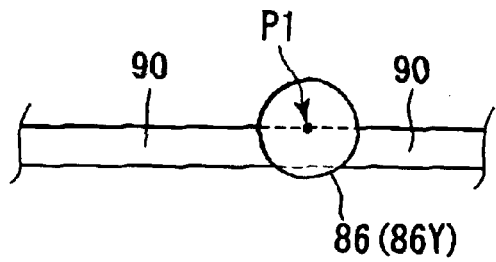
FIG. 4D is an enlarged view showing a modification of a positioning assistant.

In the embodiment shown in FIG. 3, the two boundary lines of each positioning reference line 90 are arranged such that their extension lines sandwich the central position of the corresponding positioning hole 86. In place of this arrangement, the boundary lines may be arranged such that the extension line from one of them, which is used for positioning during a teaching operation, extends through the center P1 of the corresponding positioning hole 86, as shown in FIG. 4D. In this case, positioning observation can be more easily performed.

In the embodiment shown in FIG. 3, the positioning reference lines 90 are separately formed along the contour of the holding pick 14 (62A, 64A). In place of this arrangement, all or some of the positioning reference lines 90 are formed continuous.

Figure 6:
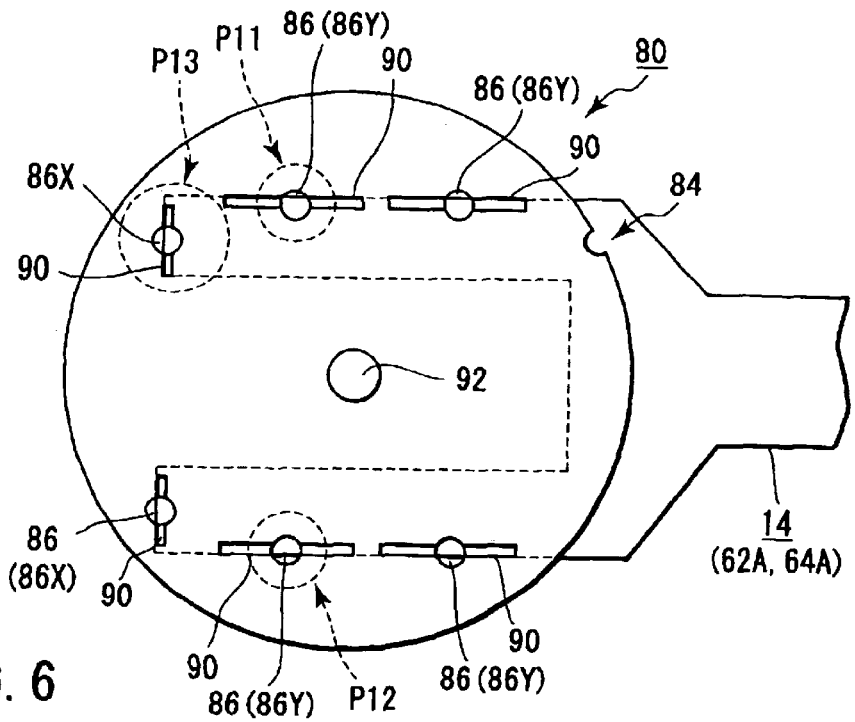
FIG. 6 is a view showing a state where the positioning substrate shown in FIG. 3 is accurately placed at the correct position on a holding pick.
Figure 7A:
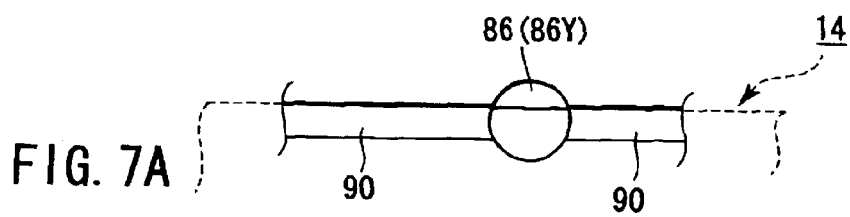
FIGS. 7A, 7B, and 7C are enlarged views respectively showing portions P11, P12, and P13 in FIG. 6.
Figure 7B:
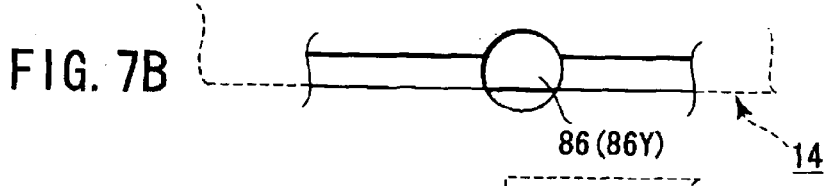
Figure 7C:
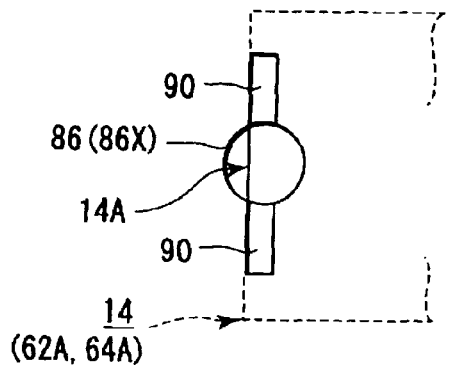

Next, an explanation will be given, with reference to FIGS. 6 to 8C as well, of positioning each of the holding picks 62A and 64A (having the same shape as the holding pick 14 shown in FIG. 23B) of the second transfer mechanism 50 relative to the orientor 56, using the positioning substrate 80 described above. FIG. 6 is a view showing a state where the positioning substrate shown in FIG. 3 is accurately placed at the correct position on a holding pick. FIGS. 7A, 7B, and 7C are enlarged views respectively showing portions P11, P12, and P13 in FIG. 6. FIGS. 8A, 8B, and 8C are enlarged views respectively showing portions P11, P12, and P13 in FIG. 3, when the positioning substrate is placed with a misalignment.

When a teaching operation is performed for each of the holding picks 62A and 64A of the second transfer mechanism 50 relative to the orientor 56 shown in FIG. 1, the control section 76 is set in a manual mode where the second transfer mechanism 50 is manually operated. The encoder for determining the coordinate position of the transfer mechanism 50 also works in this manual mode.

First, the positioning substrate 80 is accurately placed by hand at the correct position on one of the two holding picks 62A and 64A, e.g., the holding pick 62A, as shown in FIG. 6. At this time, the contour of the holding pick 62A is visually observed through the positioning holes 86 formed at separate positions of the substrate body 82. Then, the position of the positioning substrate 80 is fine-adjusted such that the radially outer boundary line of each positioning reference line 90 having a certain width accurately aligns with the contour of the holding pick 62A.

FIGS. 8A and 8B show a state where the positioning substrate 80 is placed with a misalignment by a distance L1 in the Y direction. FIG. 8C shows a state where the positioning substrate 80 is placed with a misalignment by a distance L2 in the X direction. In this case, the positioning substrate 80 is slightly shifted by hand, so that the misalignment distances L1 and L2 are offset. Then, the radially outer boundary line of the positioning reference line 90 is caused to completely align with the contour of the holding pick 62A, as shown in FIGS. 7A to 7C. In other words, the positioning substrate 80 is placed at the correct position on the holding pick 62A with high accuracy.

Then, with this state, the second transfer mechanism 50 is manually moved to the orientor 56. Then, the holding pick 62A is manually extended to deliver the positioning substrate 80 held thereon to the rotary table 58 of the orientor 56, while centering it onto the table. The coordinate position of the holding pick 62A obtained at this time is stored into the control section 76. When the positioning substrate 80 having been held on the holding pick 62A is centered onto the rotary table 58, the central positioning hole 92 formed at the center of the positioning substrate 80 is used. Specifically, the position of the holding pick 62A is adjusted, such that the central positioning hole 92 accurately aligns with the central mark 58A (see FIG. 1) formed at the center of rotary table 58 of the orientor 56, while the mark 58A is visually observed through the hole 92. Similarly, the sequential operation described above is also performed for the other holding pick 64A.

By manually performing the teaching operation, the positioning substrate 80 having been accurately held on one of the holding picks 62A and 64A is placed at the correct position on the rotary table 58 of the orientor 56. However, in the manual teaching operation, visual observation through the positioning hole 86 or central positioning hole 92 may cause a slight misalignment, depending on the angle of sight lines. It is thus referable to perform a compensation operation, as follows.

Specifically, after the manual teaching operation described above, at first, the positioning substrate 80 is placed again at the correct position on one of the holding picks 62A and 64A by hand. Then, under the control of the control section 76, the second transfer mechanism 50 is automatically operated to transfer the positioning substrate 80 onto the rotary table 58 of the orientor 56. Then, the orientor 56 is operated to detect the misalignment amount of the positioning substrate 80. Then, the coordinate position stored in the control section 76 is corrected to compensate for the misalignment amount.

The compensation operation described above can be called an automatic positioning operation as well. In this case, if the coordinate position determined by the manual teaching operation described above is accurate, the misalignment amount obtained in the automatic positioning operation described above is zero.

<Second Embodiment>

Figure 10:
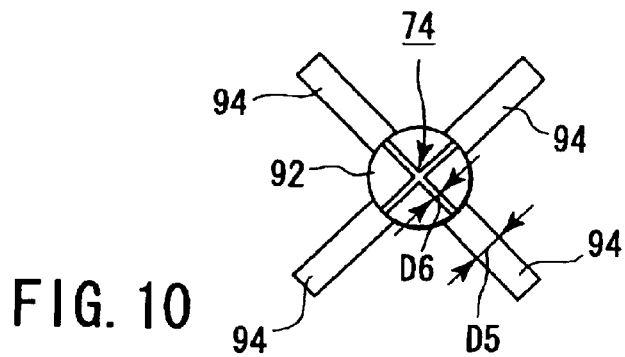
FIG. 10 is an enlarged partial view showing a portion near the central positioning hole of the positioning substrate shown in FIG. 9, during a teaching operation.

FIG. 9 is a plan view showing a positioning substrate according to a second embodiment of the present invention. FIG. 10 is an enlarged partial view showing a portion near the central positioning hole of the positioning substrate shown in FIG. 9, during a teaching operation. The positioning substrate 80A according to the second embodiment is arranged to be used for positioning the holding picks 62A and 64A relative to the tables 68 in the load-lock chambers 38A and 38B shown in FIG. 1.

Specifically, as shown in FIG. 9, four central positioning reference lines 94 are radially formed around the central positioning hole 92 of the substrate body 82, at 90-degree intervals, by scoring to have the same structure as the positioning reference lines 90 (see FIG. 3). Each of the central positioning reference lines 94 has a line width D5 of, e.g., about 1 mm, the same as that of the positioning reference lines 90. The central positioning reference lines 94 are formed to correspond to the criss-cross line mark 74 (see FIG. 2) formed on the surface of the table 68 in each of the load-lock chambers 38A and 38B.

When a teaching operation for positioning is performed, using the positioning substrate 80A according to the second embodiment, the operation is as follows. First, the positioning substrate 80A is placed by hand on the table 68 in one of the load-lock chambers, e.g., the load-lock chamber 38A, such that their centers accurately align with each other. At this time, the criss-cross line mark 74 having a line width D6 of about 0.3 mm on the table 68 is visually observed through the central positioning hole 92, as shown in FIG. 10. Then, the position of the positioning substrate 80A is adjusted such that the line mark 74 almost comes to the center of the line width of each of the central positioning reference lines 94. As a consequence, the positioning substrate 80A is placed at the correct position on the table 68.

Then, the positioning substrate 80A is moved up and kept in this state by the lifter pins 72 (see FIG. 2), which are built in the table 68. Then, one of the holding picks of the second transfer mechanism 50, e.g., the holding pick 62A is manually extended to enter under the positioning substrate 80A. Then, they are brought into contact with each other, and adjusted such that the positioning holes 86 and positioning reference lines 90 of the positioning substrate 80A align with the contour of the holding pick 62A, as explained with reference to FIGS. 6, 7A, 7B, and 7C. The coordinate position of the holding pick 62A obtained at this time is stored into the control section 76.

Similarly, the sequential operation described above is also performed for the other holding pick 64A. Furthermore, the same teaching operation is also performed for the table 68 in the other load-lock chamber 38B. By doing so, the manual teaching operation is completed. Also in this case, since a slight misalignment may be caused, it is preferable to perform a compensation operation by an automatic positioning operation, as follows.

Specifically, the positioning substrate 80A is placed at the correct position on one of the tables 68 by hand. Then, the second transfer mechanism 50 is automatically operated to receive the positioning substrate 80A. Then, the orientor 56 is used and automatically operated to detect the misalignment amount of the positioning substrate 80A, which is then compensated for. As a consequence, the coordinate position is determined with higher accuracy. It should be noted, however, that this operation is available on the premise that a teaching operation for the holding picks 62A and 64A relative to the rotary table 58 of the orientor 56 has been completed in advance.

In practice, when a wafer is transferred into each of the first and second load-lock chambers 38A and 38B, the wafer is oriented such that the position of the notch 84 is farthest from the center of the common transfer chamber 36. In other words, when a wafer or the positioning substrate 80A is transferred form the second transfer mechanism 50, the directions of the notch 84 differ from each other between transfer operations into the first and second load-lock chambers 38A and 38B. Accordingly, as explained later with reference to FIG. 22, it is necessary to independently form two groups of the positioning reference lines 90 and positioning holes 86, corresponding to the first and second load-lock chambers 38A and 38B.

Specifically, the holding picks 44A and 44B access wafers W on the tables 68 in the load-lock chambers 38A and 38B in directions different by an angle θ1 (see FIG. 1), which is formed by the load-lock chambers 38A and 38B relative to the rotational center of the first transfer mechanism 44. In this case, the wafers W have to be placed in the load-lock chambers 38A and 38B, such that their notches 84 are positioned on the extension lines of the access directions of the holding picks 44A and 44B. As a consequence, the wafers W are placed with their notch 84 positioned in directions different from each other.

In light of this fact, the positioning substrate 80A according to the second embodiment may be modified to be used for both the load-lock chambers 38A and 38B. In this case, in addition to the group of positioning assistants (combinations of the positioning holes and positioning reference lines) formed at the positions shown in FIG. 9, another group of positioning assistants is further formed at positions rotated by the angle θ1 from the former positions (see FIG. 22). This matter will be described later.

<Third Embodiment>

Figure 11:
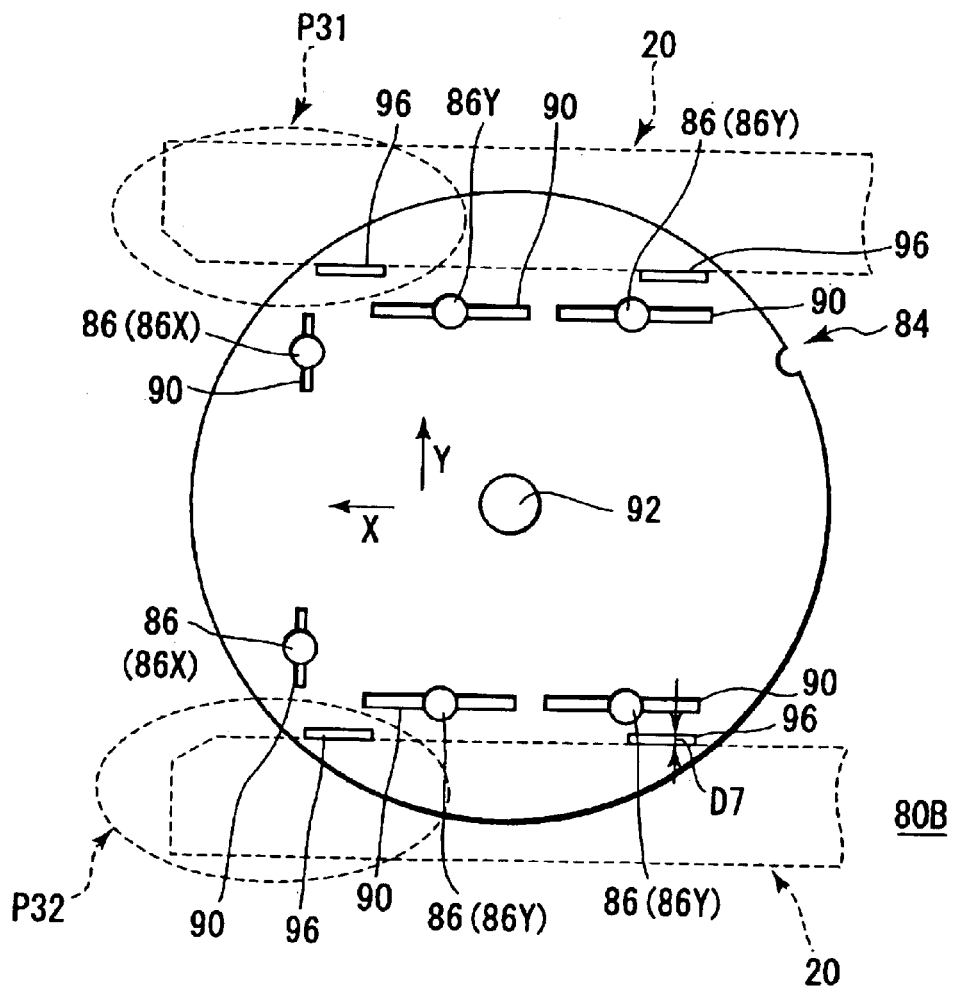
FIG. 11 is a plan view showing a positioning substrate according to a third embodiment of the present invention.

FIG. 11 is a plan view showing a positioning substrate according to a third embodiment of the present invention. FIGS. 12A and 12B are enlarged views respectively showing portions P31 and P32 in FIG. 11, when the positioning substrate shown in FIG. 11 is placed on shelves of a cassette. The positioning substrate 80B according to the third embodiment is arranged to be used for positioning the holding picks 62A and 64A relative to the shelves 20 of a cassette 22 placed on each of the I/O port structures 48A to 48C shown in FIG. 1.

Specifically, as shown in FIG. 11, four peripheral positioning reference lines (cassette position reference lines) 96 for positioning relative to the cassette are formed, two on either side of the central positioning hole 92 on the periphery of the surface of the substrate body 82. The lines 96 are formed by, e.g., scoring to have the same structure as the positioning reference lines 90 (see FIG. 3). Also in this case, each of the peripheral positioning reference lines 96 has a line width D7 of, e.g., about 1 mm, the same as that of the positioning reference lines 90.

The peripheral positioning reference lines 96 include two pairs of lines, each pair being formed along the contour of each shelf 20 in the cassette 22. Each peripheral positioning reference line 96 is formed such that one of the two boundary lines defining the line width, e.g., the boundary line on the outer side in the radial direction, is to align with the contour of the corresponding shelf 20. The reference lines 96 are parallel with the reference lines 90 described above. Each peripheral positioning reference line 96 does not extend up to the edge of the substrate 80B, but terminates at a position distant from the substrate edge by a distance D8 of, e.g., about 2 mm, to prevent the substrate 80B from cracking.

When a teaching operation for positioning is performed, using the positioning substrate 80B according to the third embodiment, the operation is as follows. First, the positioning substrate 80B is placed by hand on predetermined shelves 20 in the cassette 22, which is placed on one of the I/O port structures, e.g., the I/O port structure 48A. At this time, the position of the positioning substrate 80B is adjusted such that the peripheral positioning reference lines 96 of the positioning substrate 80B accurately align with the contours of the shelves 20.

For example, a transparent positioning cassette is used as the cassette 22. As shown in FIGS. 12A and 12B, the position of the positioning substrate 80B is adjusted such that the contours of the shelves 20 correspond to the peripheral positioning reference lines 96 on opposite sides. At this time, of the boundary lines defining the line width of each line 96, the boundary line on the outer side in the radial direction of the substrate is caused to accurately align with the contour. As a consequence, the positioning substrate 80B is placed at the correct position on the shelves 20.

Then, one of the holding picks of the second transfer mechanism 50, e.g., the holding pick 62A is manually extended to enter under the positioning substrate 80B. Then, they are brought into contact with each other, and adjusted such that the positioning holes 86 and positioning reference lines 90 of the positioning substrate 80B align with the contour of the holding pick 62A, as explained with reference to FIGS. 6, 7A, 7B, and 7C. The coordinate position of the holding pick 62A obtained at this time is stored into the control section 76.

Similarly, the sequential operation described above is also performed for cassettes 22 placed on the other I/O port structures 48B and 48C. By doing so, the manual teaching operation is completed. Also in this case, since a slight misalignment may be caused, it is preferable to perform a compensation operation by an automatic positioning operation, as follows.

Specifically, the positioning substrate 80B is placed at the correct position on a pair of the shelves 20 by hand. Then, the second transfer mechanism 50 is automatically operated to receive the positioning substrate 80B. Then, the orientor 56 is used and automatically operated to detect the misalignment amount of the positioning substrate 80B, which is then compensated for. As a consequence, the coordinate position is determined with higher accuracy. It should be noted, however, that this operation is available on the premise that a teaching operation for the holding picks 62A and 64A relative to the rotary table 58 of the orientor 56 has been completed in advance.

<Fourth Embodiment>

In the embodiments described above, explanations have been given of a teaching operation for positioning in relation to the holding picks 62A and 64A of the second transfer mechanism 50. Then, an explanation will be given of a positioning substrate for the first transfer mechanism 44 in the common transfer chamber 36 (see FIG. 1). If all the holding picks 44A, 44B, 62A, and 64A of the transfer mechanisms 44 and 50 have the same shape and dimensions, each of the positioning substrates described above can be used for all of them. However, since the holding picks differ in shape or the like, different positioning substrates are used in accordance with the different shapes of the holding picks.

FIG. 13 is a plan view showing a positioning substrate according to a fourth embodiment of the present invention. FIG. 14 is an enlarged view showing a portion P41 shown in FIG. 13.

In the processing system shown in FIG. 1, each of the holding picks 44A and 44B of the first transfer mechanism 44 in the common transfer chamber 36 has the same shape as the holding pick 13 shown in FIG. 23A. The pick distal ends 13A of the bifurcated holding pick shown in FIG. 23A each form an essentially semi-circular arc, unlike those shown in FIG. 23B each forming straight line. Accordingly, the positioning substrate 80C according to the fourth embodiment is provided with positioning reference lines 90A, which form not straight lines but arcs along the contours of the pick distal ends 13A. The reference lines 90A extend respectively across X-direction positioning holes 86X corresponding to the pick distal ends 13A. The structures of the other Y-direction positioning holes 86Y and positioning reference lines 90 across them are the same as those show in FIG. 3.

The positioning substrate 80C is provided with a central positioning hole 92 and a criss-cross shape formed of central positioning reference lines 94A, at the center. The central positioning reference lines 94A is formed at a position rotated by an angle θ1 relative to the central positioning reference lines 94 of the second embodiment explained with reference to FIG. 9. The central positioning hole 92 and central positioning reference lines 94A allow positioning for the table 68 in each of the load-lock chambers 38A and 38B.

In the positioning substrate 80C according to the fourth embodiment, a notch 84 is formed at a position different from that of the embodiments described above. The notch 84 is on the extension line from one reference line, extending in the horizontal direction, in FIG. 13, of the central positioning reference lines 94A forming a criss-cross shape.

Figure 15:
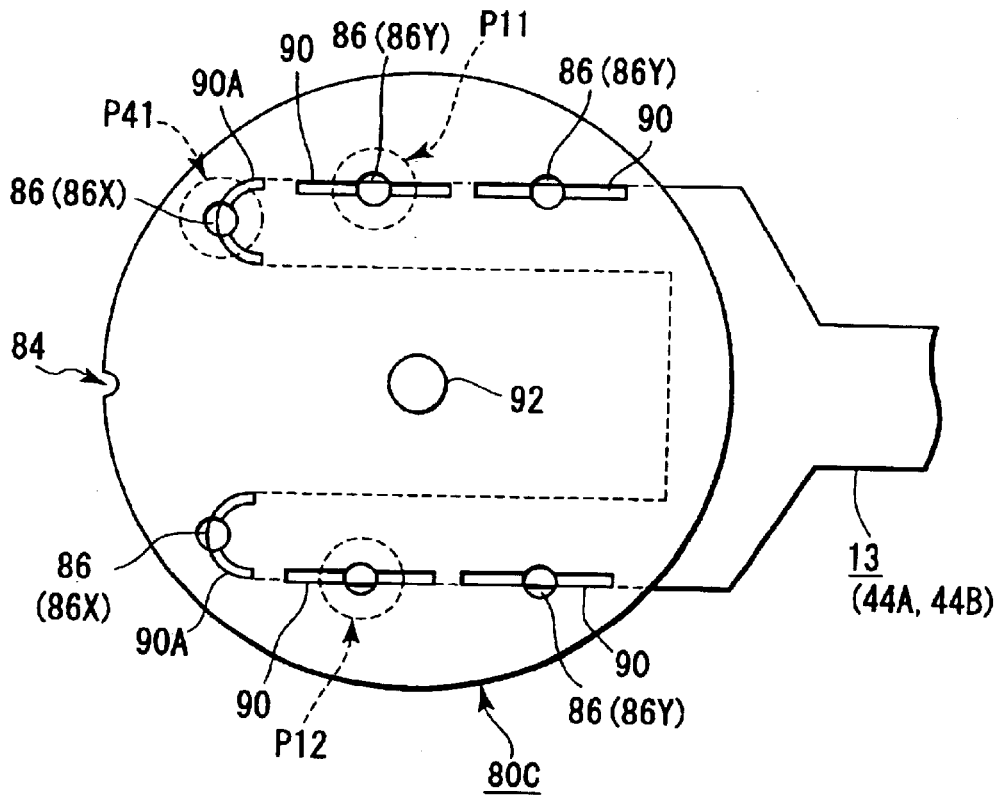
FIG. 15 is a view showing the positional relationship between the positioning substrate shown in FIG. 13 and a holding pick, during a teaching operation.
Figure 16:
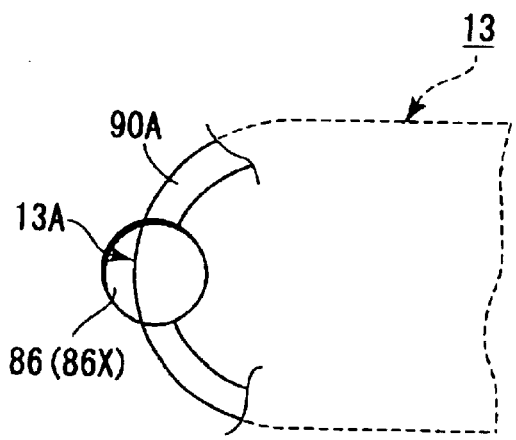
FIG. 16 is an enlarged view showing a portion P41 shown in FIG. 15.

Next, an explanation will be given, with reference to FIGS. 15 and 16 as well, of a teaching operation for the holding picks 44A and 44B of the first transfer mechanism 44, using the positioning substrate 80C. FIG. 15 is a view showing the positional relationship between the positioning substrate shown in FIG. 13 and a holding pick, during a teaching operation. FIG. 16 is an enlarged view showing a portion P41 shown in FIG. 15. The teaching operation using the positioning substrate 80C according to the fourth embodiment includes a case where it is performed relative to the respective processing apparatuses 34A to 34D, and a case where it is performed relative to the respective load-lock chambers 38A and 38B.

When a teaching operation is performed relative to the respective processing apparatuses 34A to 34D, it is performed as follows. First, the positioning substrate 80C is accurately placed by hand at the correct position on one of the two holding picks 44A and 44B, e.g., the holding pick 44A, as shown in FIG. 15. At this time, as shown in FIG. 16, the contours of the distal ends 13A of the holding pick 44A are visually observed through the X-direction positioning holes 86X. Then, positional adjustment is performed such that the radially outer one of the two boundary lines, which define the predetermined line width of each positioning reference line 90A, aligns with the contour of each distal end 13A of the holding pick 44A. Positional adjustment for the Y-direction positioning holes 86Y is performed in the same manner, as explained with reference to FIGS. 7A, 7B, and 7C.

Then, the holding pick 44A is manually extended to one of the processing apparatuses, e.g., the processing apparatus 34A, and is centered relative to the susceptor 42A therein. The coordinate position of the holding pick 44A obtained at this time is stored into the control section 76. Similarly, a teaching operation is also performed for each of the susceptor 42B to 42D in the other processing apparatuses 34B to 34D. Furthermore, the sequential operation described above is also performed for the other holding pick 44B.

On the other hand, when a teaching operation is performed relative to each table 68 in the load-lock chambers 38A and 38B, it is performed as follows. First, the positioning substrate 80C is placed by hand on the table 68 such that they accurately align with each other, as explained with reference to FIGS. 9 and 10. Then, the positioning substrate 80C is moved up and kept in this state by the lifter pins 72 (see FIG. 2). Then, the holding pick 44A is manually extended to enter under the positioning substrate 80C thus lifted. Then, the holding pick 44A and the positioning substrate 80C are brought into contact with each other, and adjusted such that they accurately align with each other, as explained with reference to FIGS. 15 and 16. The coordinate position of the holding pick 44A obtained at this time is stored into the control section 76.

Similarly, the sequential operation described above is also performed for the table 68 in the other load-lock chamber. By doing so, the manual teaching operation is completed. In this case, as described above, when a wafer is transferred into each of the first and second load-lock chambers 38A and 38B, the wafer is oriented such that the position of the notch is farthest from the rotational center of the first transfer mechanism 44. Accordingly, only one group of the positioning hole and positioning reference lines described above suffice the two load-lock chambers 38A and 38B.

As a method of performing a teaching operation relative to the table 68, a sequence reverse to that described above may be adopted. Specifically, at first, the positioning substrate 80C is placed by hand on one holding pick 44A, while it is accurately positioned. Then, the holding pick 44A is manually extended, e.g., above the table 68, and the positioning substrate 80C is received by the lifter pins 72 at a position that seems proper. The coordinate position of the holding pick 44A obtained at this time is stored into the control section 76. In this case, the lifter pins 72 are then moved down to observe whether the positioning substrate 80C is actually placed at the correct position on the table 68. If there is a misalignment of the positioning substrate 80C, the operation described above is repeated by try and error to remove the misalignment.

If the shape and dimensions of the holding picks 62A and 64A of the second transfer mechanism 50 are the same as those of the holding pick shown in FIG. 23A, a teaching operation for them can be performed, using the positioning substrate 80C shown in FIG. 13.

<Fifth Embodiment>

Figure 17:
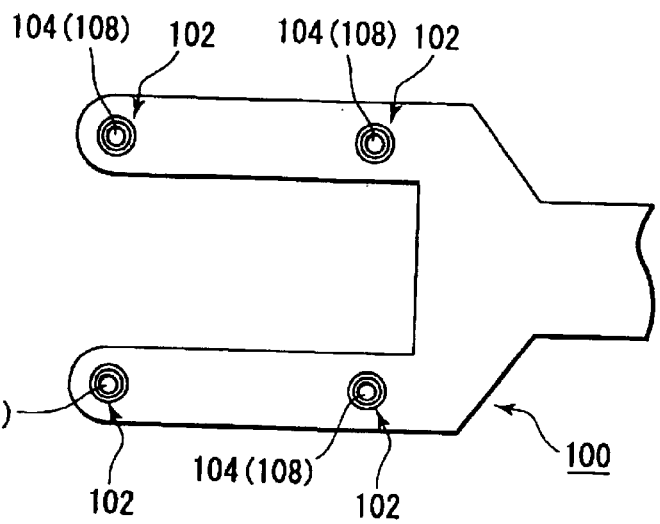
FIG. 17 is a plan view showing another example of a holding pick for a transfer mechanism.
Figure 18:
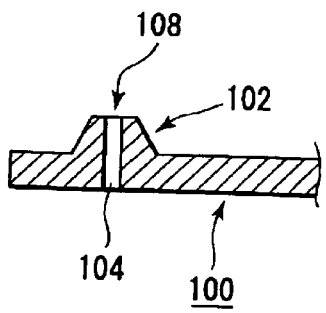
FIG. 18 is an enlarged sectional view showing the holding pick shown in FIG. 17.

Other than the holding picks 62A 64A, 44A, and 44B, a holding pick 100 having a shape as shown in FIGS. 17 and 18 may be used. FIG. 17 is a plan view showing another example of a holding pick for a transfer mechanism. FIG. 18 is an enlarged sectional view showing the holding pick shown in FIG. 17.

The holding pick 100 has, e.g., the same plan-view shape as the holding pick 13(44A, 44B) shown in FIG. 23A, but is provided with a plurality of, e.g., four in this embodiment, holding projections 102 formed on the top surface. A through-hole 104 is formed vertically through each holding projection 102. The holding projections 102 support a semiconductor wafer, while their tops are in contact with the bottom of the wafer. In this case, the upper opening of each through-hole 104 can be used as a positioning reference mark 106.

Figure 19:
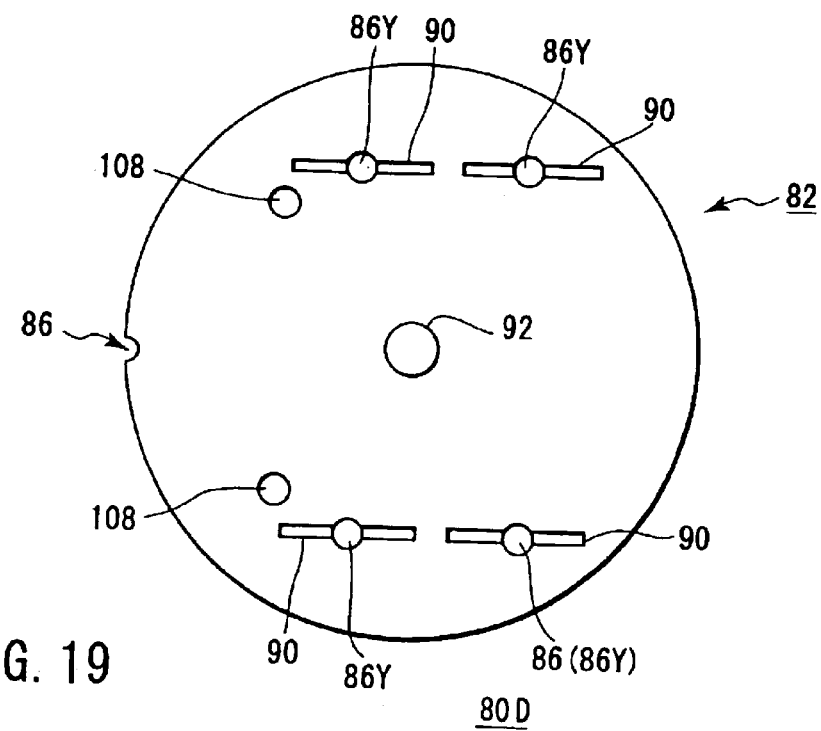
FIG. 19 is a plan view showing a positioning substrate according to a fifth embodiment of the present invention.
Figure 20:
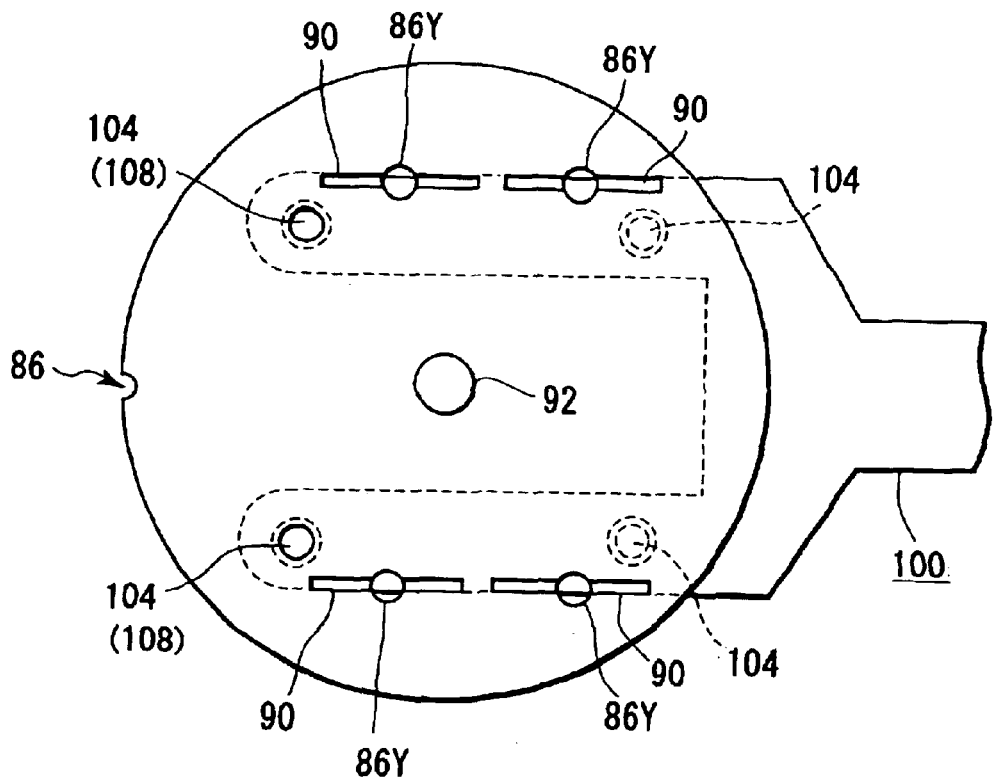
FIG. 20 is a plan view showing the positional relationship between the positioning substrate shown in FIG. 19 and a holding pick, during a teaching operation.
Figure 21:
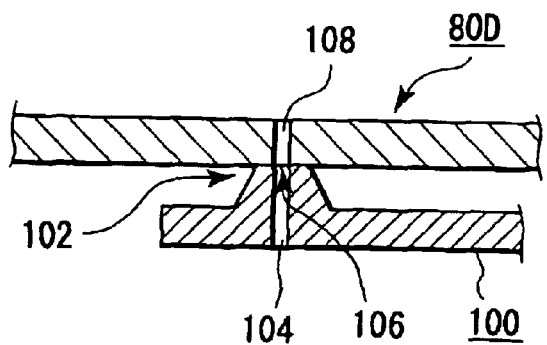
FIG. 21 is an enlarged sectional view showing a part of the state shown in FIG. 20.
Figure 24:
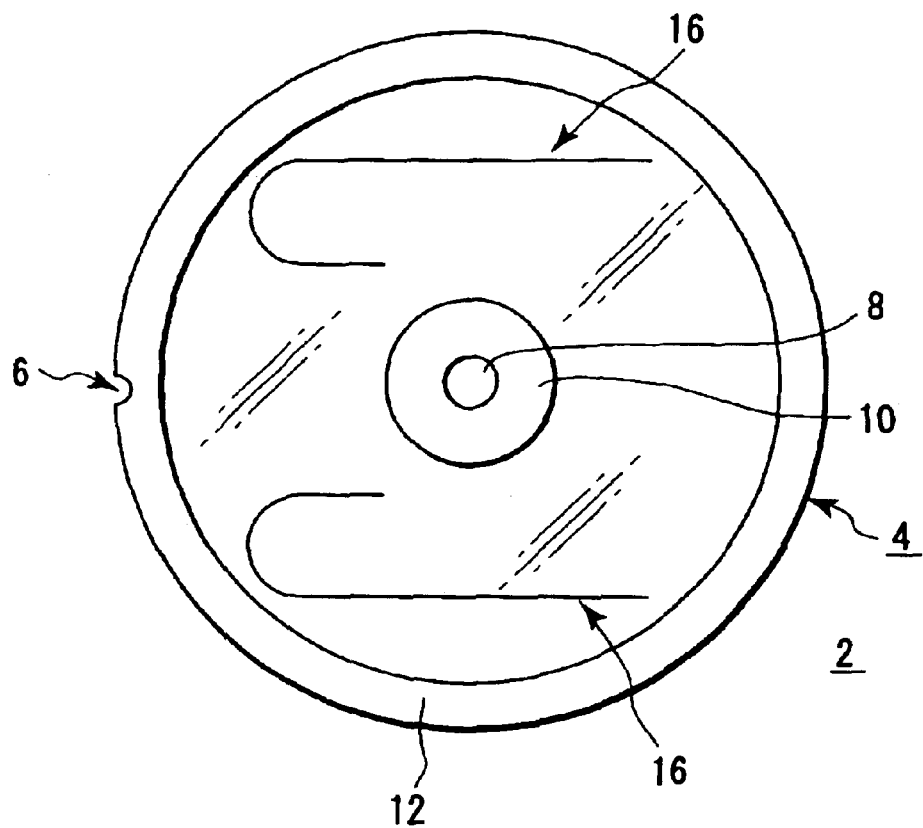
FIG. 24 is a plan view showing a conventional positioning substrate corresponding to the holding pick shown in FIG. 23A.
Figure 25:
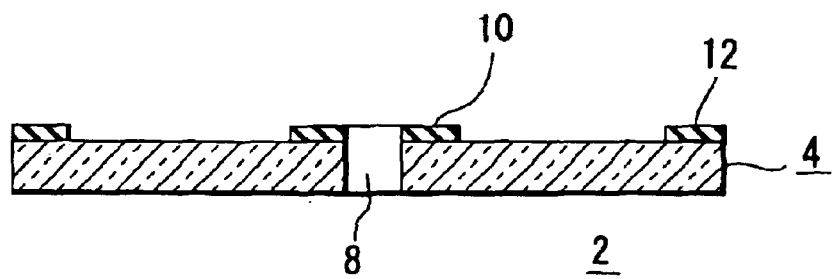
FIG. 25 is a sectional view showing the positioning substrate shown in FIG. 24.

Specifically, a positioning substrate 80D according to the fifth embodiment shown in FIGS. 19 to 21 may be used relative to the holding pick 100 having the structure described above. FIG. 19 is a plan view showing a positioning substrate according to the fifth embodiment of the present invention. FIG. 20 is a plan view showing the positional relationship between the positioning substrate shown in FIG. 19 and a holding pick, during a teaching operation. FIG. 21 is an enlarged sectional view showing a part of the state shown in FIG. 20.

In this case, the substrate is provided with the same structures as those shown in FIG. 3, as regards positioning for one of X and Y directions, e.g., the Y direction in FIG. 19 with Y-direction positioning holes 86Y and corresponding positioning reference lines 90. On the other hand, as regards positioning for the X direction, the substrate is provided with mark observation holes 108 formed at, e.g., positions corresponding to the two holding projections 102 on the distal end side of the holding pick 100. The mark observation holes 108 penetrate the substrate and have the same inner diameter as the through-holes 104.

Using the positioning substrate 80D thus formed, a positioning operation is performed, as follows. As shown in FIGS. 20 and 21, the Y-direction positioning holes 86Y are used in the same manner as explained with reference to FIG. 3. On the other hand, the mark observation holes 108 are used to visually observe therethrough the reference marks 106, which are the openings of the through-holes 104 of the holding pick 100. Then, positional adjustment is performed such the openings of the mark observation holes 108 accurately align with the reference marks 106, as shown in FIG. 21. As a consequence, the substrate and holding pick align with each other in both the X and Y directions with high accuracy.

The positioning substrate 80D according to the fifth embodiment may be combined with a feature of the second embodiment shown in FIG. 9 or the third embodiment shown in FIG. 11.

<Sixth Embodiment>

In the embodiments described above, explanations have been given of positioning substrates, each of which corresponds to one holding pick having a specific shape and dimensions. Next, an explanation will be given of a positioning substrate, which meets by itself holding picks of several kinds having different shapes and dimensions, included in a processing system. FIG. 22 is a plan view showing a positioning substrate according to a sixth embodiment of the present invention, in light of this aspect.

As shown in FIG. 22, the positioning substrate 80E according to the sixth embodiment is arranged to incorporate positioning assistants according to the first to fourth embodiments into one substrate. The same reference numerals as used in the embodiments described above denote the corresponding portions. Specifically, the positioning substrate 80E is provided with a plurality of groups of positioning assistants or the like, such as first to seventh groups 120, 122, 124, 126, 138, 130, and 132, as follows.

The first group 120 is formed of positioning holes 86 (86X, 86Y) and positioning reference lines 90 according to the first embodiment shown in FIG. 3. The first group 120 is located to correspond to the second load-lock chamber 38B. The second group 122 is also formed of positioning holes 86 (86X, 86Y) and positioning reference lines 90 according to the first embodiment shown in FIG. 3. The second group 122 is located at a position rotated by an angle θ1 relative to the first group 120, to correspond to the second load-lock chamber 38A.

The third group 124 is formed of a positioning hole 92 and central positioning reference lines 94 according to the second embodiment shown in FIG. 9. The fourth group 126 is formed of peripheral positioning reference lines 96 according to the third embodiment shown in FIG. 11. The lines 96 of the fourth group 126 are parallel with the reference lines of the second group 122. The fifth group 128 is also formed of peripheral positioning reference lines 96 according to the third embodiment shown in FIG. 11. The lines 96 of the fifth group 128 are located at a position rotated by an angle θ1 relative to the fourth group 126, to be parallel with the reference lines of the first group 120.

The sixth group 130 is formed of positioning holes 86X and 86Y and positioning reference lines 90 and 90A according to the fourth embodiment shown in FIG. 13. The seventh group 132 is formed of a central positioning hole 92 and central positioning reference lines 94A shown in FIGS. 4A, 4B, and 4C.

As explained in the fourth embodiment, the holding picks 44A and 44B (see FIG. 1) having the same shape and dimensions access the tables 68 in the load-lock chambers 38A and 38B in different directions with an angle θ1 therebetween. In this respect, the notch 84 is always positioned on the extension line in the access direction. Accordingly, as regards the positioning holes 86X and 86Y and positioning reference lines 90, the first group 120 and second group 122 are disposed differently by an angle θ1. With this arrangement, all the teaching operations for positioning in the processing system 32 shown in FIG. 1 can be performed, using only this positioning substrate 80E, i.e., only one kind of substrate.

As described above, with a positioning substrate according to the embodiments described above, organic contamination is prevented in a processing system. Furthermore, thermal deformation of the substrate is prevented, and a teaching operation can be performed with high positional accuracy. Where the substrate body of the positioning substrate is made of the same material as actual target substrates, it can have the same properties, such as specific gravity, friction coefficient, and the like. In this case, the positioning substrate can be handled under the same conditions as those for actual target substrates.

As shown in FIG. 22, where a number of positioning holes are formed, positioning reference lines are preferably formed to have a certain large length. With this arrangement, it is easier to judge the correspondence of the positioning reference lines relative to pick shapes.

In each of the embodiments described above, the positioning holes and positioning reference lines are formed at positions on a substrate other than the detection target position by optical sensors for detecting the presence or absence of wafers. The arrangement of the semiconductor processing system 32 shown in FIG. 1 is taken only for example. The present invention can be applied to any semiconductor processing system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A positioning substrate for performing a teaching operation on a transfer mechanism for transferring a target substrate in a semiconductor processing system, the positioning substrate comprising:

a substrate body made of a material selected from the group consisting of the same material as the target substrate, semiconductor, compound semiconductor, and ceramic; and a positioning assistant comprising a combination of a positioning hole and a positioning reference line formed in the substrate body, the positioning hole being formed to penetrate the substrate body in a thickness direction, and the positioning reference line being formed on a surface of the substrate body to extend across an opening of the positioning hole and have a predetermined width.

2. The positioning substrate according to claim 1, wherein a plurality of positioning assistants are disposed at a plurality of positions on a contour of a holding pick of the transfer mechanism.

3. The positioning substrate according to claim 2, wherein, in each positioning assistant, the positioning hole has a center located on an extension line from one of two boundary lines defining the positioning reference line.

4. The positioning substrate according to claim 2, wherein the positioning assistants include an X-direction assistant for determining a position in a back-and-forth direction of the holding pick, and a Y-direction assistant for determining a position in a direction almost perpendicular to the back-and-forth direction.

5. The positioning substrate according to claim 1, further comprising a mark observation hole formed to penetrate the substrate body in the thickness direction, and to observe positional alignment relative to a reference mark formed in a holding pick of the transfer mechanism.

6. The positioning substrate according to claim 2, wherein the positioning reference line comprises a line segment extending along the contour of the holding pick in part or as a whole.

7. The positioning substrate according to claim 1, wherein the positioning hole is a central positioning hole formed at a center of the substrate body, and configured to observe a line mark formed on a surface of a worktable, on which the target substrate is placed.

8. The positioning substrate according to claim 1, further comprising a peripheral positioning reference line, which is formed on a periphery of a surface of the substrate body, and has a predetermined width.

9. The positioning substrate according to claim 8, wherein the peripheral positioning reference line is configured to align with a contour of a shelf in a cassette for storing the target substrate.

10. The positioning substrate according to claim 1, wherein the substrate body has a substantially the same outer contour as the target substrate.

11. A positioning substrate for performing a teaching operation on a transfer mechanism for transferring a target substrate in a semiconductor processing system, the positioning substrate comprising:

a substrate body made of a material selected from the group consisting of the same material as the target substrate, semiconductor, compound semiconductor, and ceramic; and a plurality of positioning-assist groups, each of which comprises a plurality of positioning assistants, each positioning assistant comprising a combination of a positioning hole and a positioning reference line formed in the substrate body, the positioning hole being formed to penetrate the substrate body in a thickness direction, and the positioning reference line being formed on a surface of the substrate body to extend across an opening of the positioning hole and have a predetermined width, wherein the plurality of positioning assistants of each positioning-assist group are disposed at a plurality of positions on a contour of a holding pick of the transfer mechanism.

12. The positioning substrate according to claim 11, wherein the positioning-assist groups are disposed to correspond to a plurality of holding picks having different contours.

13. The positioning substrate according to claim 11, wherein the positioning-assist groups are disposed to correspond to circumstances where one holding pick accesses in different directions.

14. The positioning substrate according to claim 11, wherein the positioning-assist groups are disposed to correspond to a plurality of holding picks having different contours, and to circumstances where each holding pick accesses in different directions.

15. The positioning substrate according to claim 11, wherein the positioning assistants of each positioning-assist group include an assistant for determining a position in a back-and-forth direction of the holding pick, and an assistant for determining a position in a direction almost perpendicular to the back-and-forth direction.

* * * * *